(12) United States Patent
Betz et al.

(10) Patent No.: US 10,219,412 B1
(45) Date of Patent: Feb. 26, 2019

(54) CONNECTOR ASSEMBLY AND ASSOCIATED HEAT SINK HOUSING FOR USE IN A RADIO UNIT

(71) Applicant: Nokia Solutions and Networks Oy, Espoo (FI)

(72) Inventors: Todd Betz, Corinth, TX (US); Michael Bartlett, Hurst, TX (US); Andrew Morrison, Euless, TX (US); Earl Ponceti, McKinney, TX (US)

(73) Assignee: Nokia Solutions and Networks Oy, Espoo (FI)

( * ) Notice: Subject to any disclaimer, the term of this patent is extended or adjusted under 35 U.S.C. 154(b) by 0 days.

(21) Appl. No.: 15/823,346

(22) Filed: Nov. 27, 2017

(51) Int. Cl.
*H05K 7/20* (2006.01)
*H05K 1/14* (2006.01)
(Continued)

(52) U.S. Cl.
CPC ..... *H05K 7/20409* (2013.01); *H01L 23/3672* (2013.01); *H01R 24/50* (2013.01);
(Continued)

(58) Field of Classification Search
CPC .............. H05K 7/20409; H05K 1/141; H05K 7/20154; H05K 3/336; H05K 2201/049; H05K 2201/10121; H05K 3/0061; H05K 13/00; H05K 1/0274; H01L 23/3672; H01L 2924/00; H01L 2924/00014; H01R 24/50; H01R 12/57; H01R 12/716; H01R 12/727; G02B 6/4292; G02B 6/4201; G02B 6/4204; G02B 6/4257; G02B 6/423
(Continued)

(56) References Cited

U.S. PATENT DOCUMENTS

| 6,816,376 B2 | 11/2004 | Bright et al. |
| 8,485,739 B2 * | 7/2013 | Yi ........................ G02B 6/4269 385/92 |
| 9,124,025 B2 | 9/2015 | Xue et al. |

FOREIGN PATENT DOCUMENTS

CN          102164074 A          8/2011

OTHER PUBLICATIONS

Min et al., "Fabrication and Performance Analysis of a High-Coupling-Efficiency and Convenient-Integration Optical Transceiver", Optoelectronics Letters, vol. 13, No. 4, Jul. 2017, pp. 250-253.

* cited by examiner

*Primary Examiner* — Mandeep S Buttar
(74) *Attorney, Agent, or Firm* — Nokia Technologies Oy

(57) ABSTRACT

A connector assembly and heat sink configured to be received by a radio unit are provided. An example connector assembly includes a printed wiring board (PWB) at least partially disposed within the radio unit when in an operational configuration, and the PWB defines an extension at least partially disposed exterior to the radio unit when in the operational configuration. The connector assembly includes one or more optoelectronic components configured to convert between optical signals and electrical signals supported by the PWB, and at least a portion of the one or more optoelectronic components are disposed on the extension of the PWB. The connector assembly also includes a heat sink housing attached to the PWB that encloses the extension of the PWB and optoelectronic components disposed on the extension in order to dissipate heat from the optoelectronic components to an exterior environment of the connector assembly.

18 Claims, 7 Drawing Sheets

(51) Int. Cl.
*H01L 23/367* (2006.01)
*H01R 24/50* (2011.01)
*H05K 3/36* (2006.01)

(52) U.S. Cl.
CPC .......... *H05K 1/141* (2013.01); *H05K 7/20154* (2013.01); *H05K 3/366* (2013.01); *H05K 2201/049* (2013.01); *H05K 2201/10121* (2013.01)

(58) Field of Classification Search
USPC .......... 361/714, 704, 709, 736, 679.54, 715, 361/728, 760, 802; 439/485, 55, 620.15, 439/620.21, 63, 733.1; 398/115, 117
See application file for complete search history.

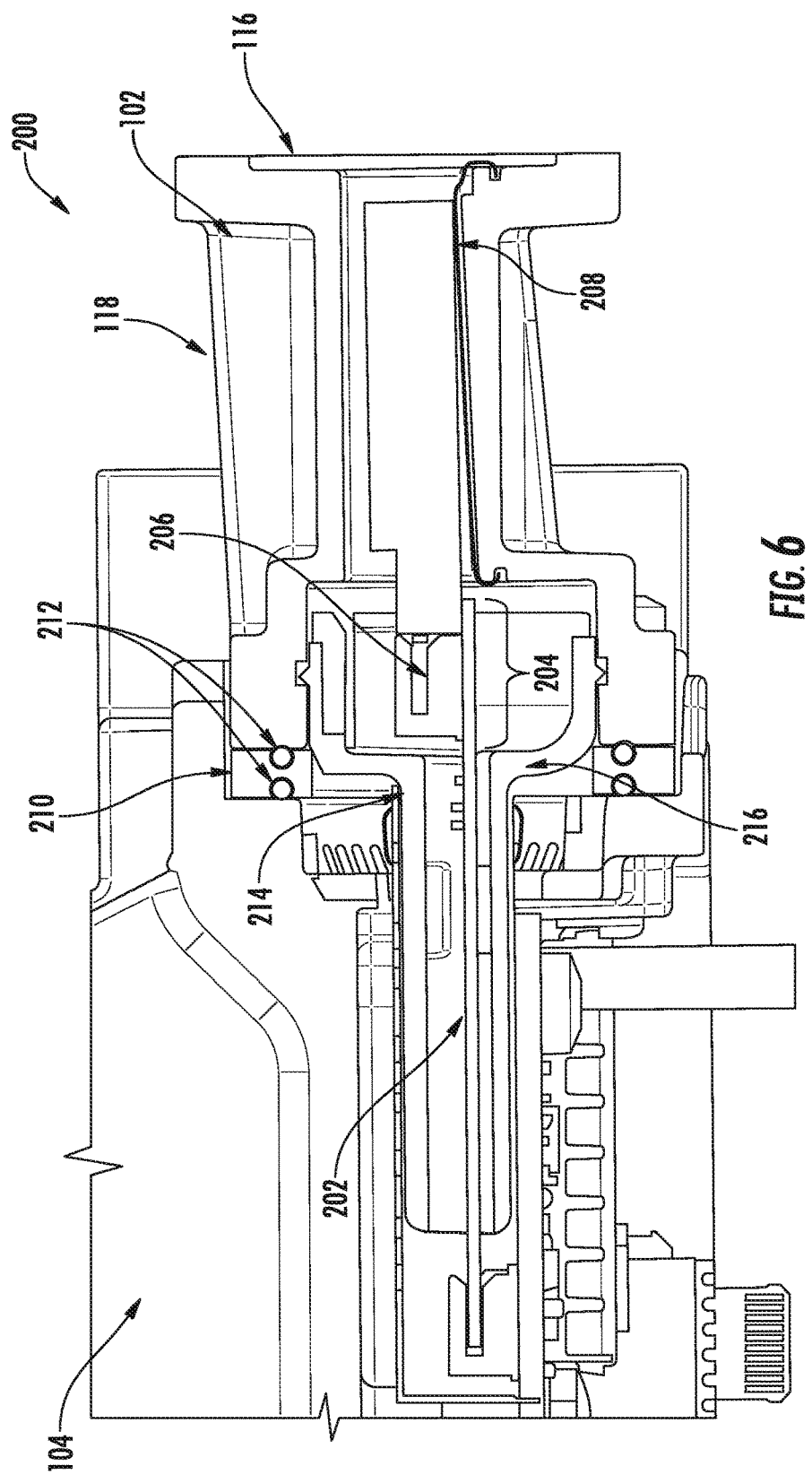

CONNECTOR ASSEMBLY AND ASSOCIATED HEAT SINK HOUSING FOR USE IN A RADIO UNIT

TECHNOLOGICAL FIELD

An example embodiment relates generally to radio units used in communication networks and, more particularly, to heat sink housings for increasing the heat dissipation and thermal performance of connector assemblies used in radio units.

BACKGROUND

Communication networks (e.g., cellular networks, wireless networks, or the like) often utilize various combinations of modules, connectors, interfaces, radio units, cables, and other circuitry to establish connections between various locations. By way of example, remote radio units (RRUs) (e.g., a remote radio head (RRH)) are conventionally located on a cellular tower and function as an interface between optical and electrical components. Often, the various optical and electrical components used in these interfaces generate heat during operation which may impair critical circuitry housed within the RRU. In particular, optoelectronic components housed by the connectors that convert between optical and electrical signals may sometimes be subjected to temperatures within the RRU that are above the operating temperature limit for the optoelectronic components. Such temperature excursions may hinder the desired operation of the optoelectronic components and/or may reduce the operational lifetime of the optoelectronic components.

BRIEF SUMMARY

A connector assembly configured to be received by a radio unit is provided. The connector assembly may include a printed wiring board (PWB) configured to be at least partially disposed within the radio unit when in an operational configuration, and the PWB may define an extension at least partially disposed exterior to the radio unit when in the operational configuration. The connector assembly may include one or more optoelectronic components configured to convert between optical signals and electrical signals supported by the PWB, and at least a portion of the one or more optoelectronic components may be disposed on the extension of the PWB. The connector assembly may further include a heat sink housing attached to the PWB and disposed adjacent the radio unit when in the operational configuration. The heat sink housing may enclose the extension of the PWB and the portion of the one or more optoelectronic components disposed on the extension, and the heat sink housing may be configured to dissipate heat from the portion of the one or more optoelectronic components to an exterior environment of the connector assembly.

In some embodiments, the connector assembly may also include a separation plate disposed between the radio unit and the heat sink housing, and the separation plate may be configured to promote thermal isolation between the heat sink housing and the radio unit.

In some further embodiments, the connector assembly may include one or more gaskets defined by the separation plate configured to seal the connector assembly from the exterior environment of the connector assembly.

In some still further embodiments, the connector assembly may include a spring element defined by the heat sink housing, and the spring element may be configured to urge contact between the heat sink housing and the extension of the PWB.

In some other embodiments, the heat sink housing of the connector assembly may include a first end configured to engage at least one of the PWB or the radio unit and a second end configured to receive one or more optical fibers. The heat sink housing may further include one or more ridges extending between the first end and the second end, and the one or more ridges may be configured to increase the structural integrity of the heat sink housing and provide increased heat dissipation.

In some embodiments, the portion of the one or more optoelectronic components disposed on the extension of the PWB may include small form pluggable optical transceiver circuitry.

In other embodiments, the heat sink housing may be removable from the connector assembly.

In any of the above connector assembly embodiments, the connector assembly may include one or more adapter elements configured to align the connector assembly and the radio unit when in the operational configuration.

A heat sink housing is also provided. The heat sink housing may include a first end portion configured to engage a printed wiring board (PWB), and the PWB may include an interior section configured to be received by a radio unit when in an operational configuration and an extension configured to be disposed at least partially exterior to the radio unit when in the operational configuration. The heat sink housing may include a compartment disposed within the heat sink housing configured to enclose the extension of the PWB when in the operational configuration. The heat sink housing may also include a second end portion configured to receive a transmission medium, where in the operational configuration, the heat sink housing is disposed adjacent the radio unit and configured to dissipate heat from the compartment to an exterior environment of the heat sink housing.

In some embodiments, the first end portion further includes a separation plate configured to promote thermal isolation between the heat sink housing and the radio unit when in the operational configuration.

In other embodiments, the heat sink housing includes one or more gaskets defined by the separation plate configured to seal the first end portion of the heat sink housing from the exterior environment of the heat sink housing when in the operational configuration.

In some further embodiments, the heat sink housing includes a spring element configured to urge contact between the heat sink housing and the extension of the PWB.

In some still further embodiments, the extension of the PWB supports one or more optoelectronic components.

In some cases, the heat sink housing is removable from the radio unit.

In any of the above heat sink housing embodiments, the transmission medium may include one or more optical fibers.

BRIEF DESCRIPTION OF THE SEVERAL VIEWS OF THE DRAWINGS

Figure 1:
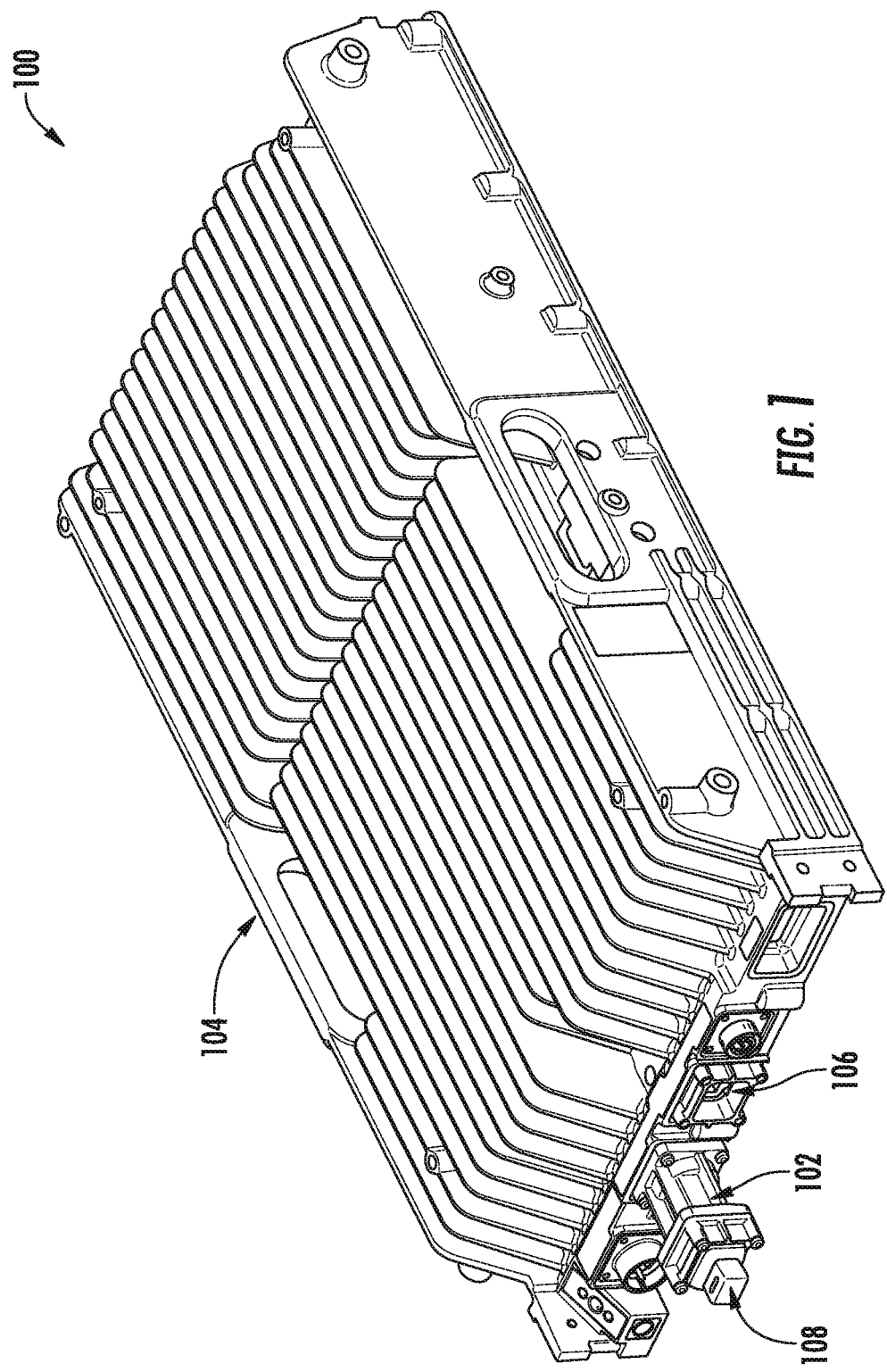
Figure 2:
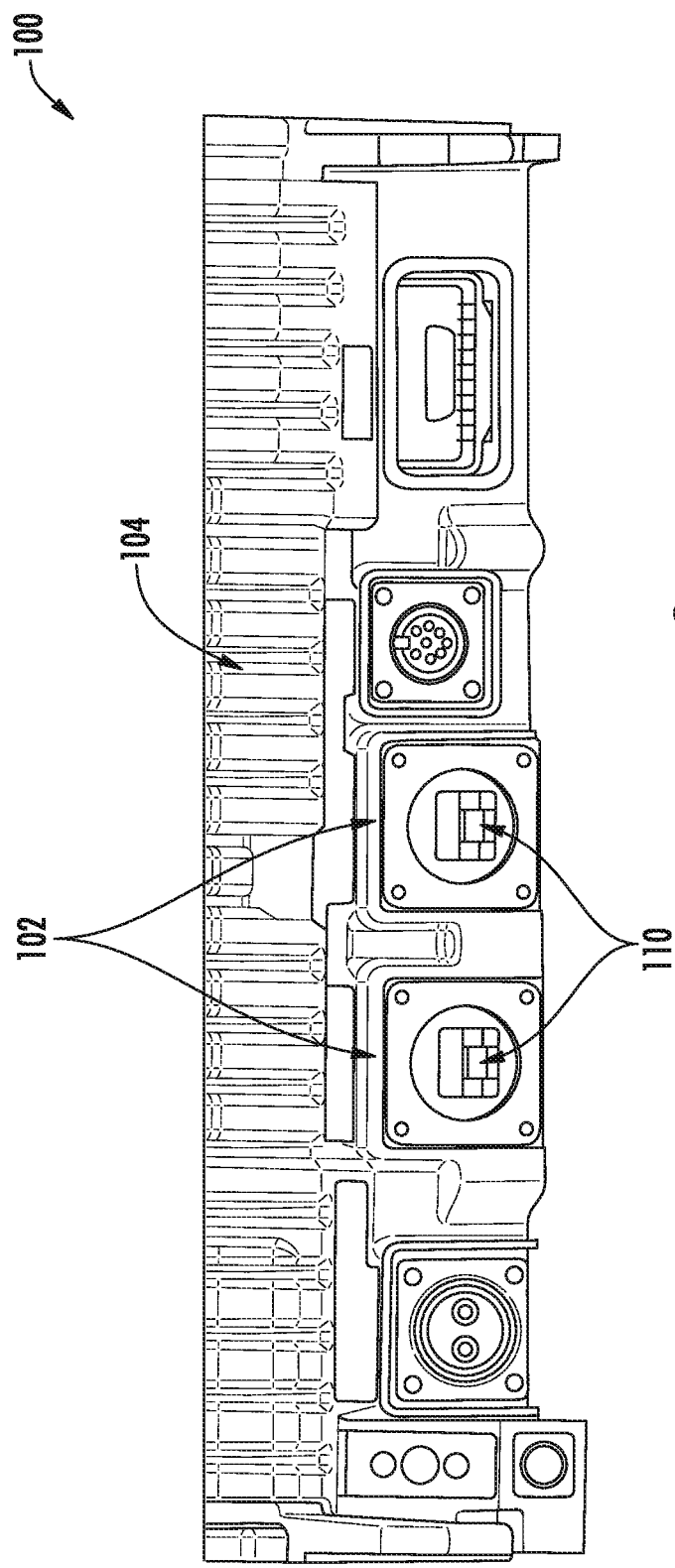
Figure 3:
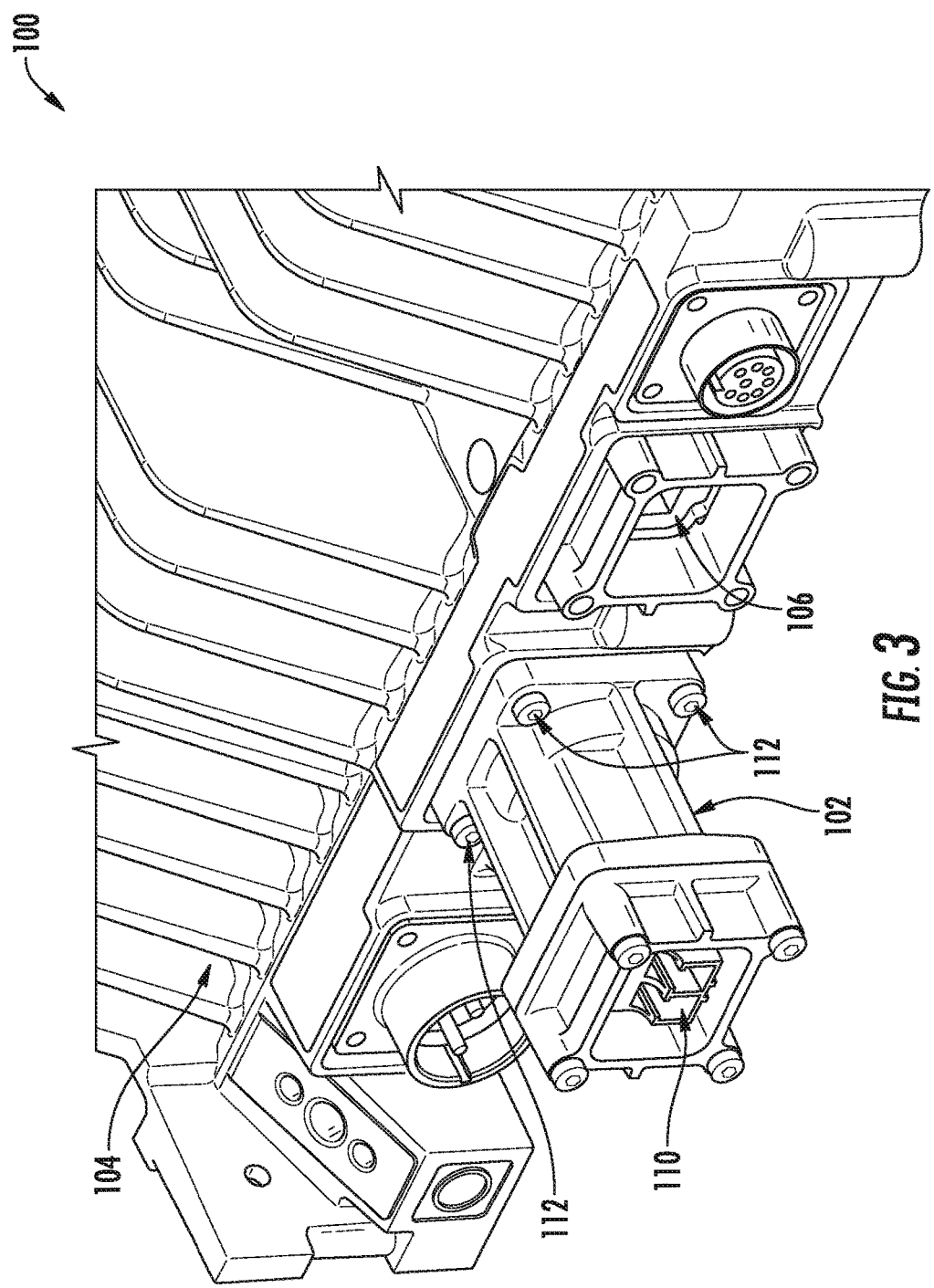
Figure 4A:
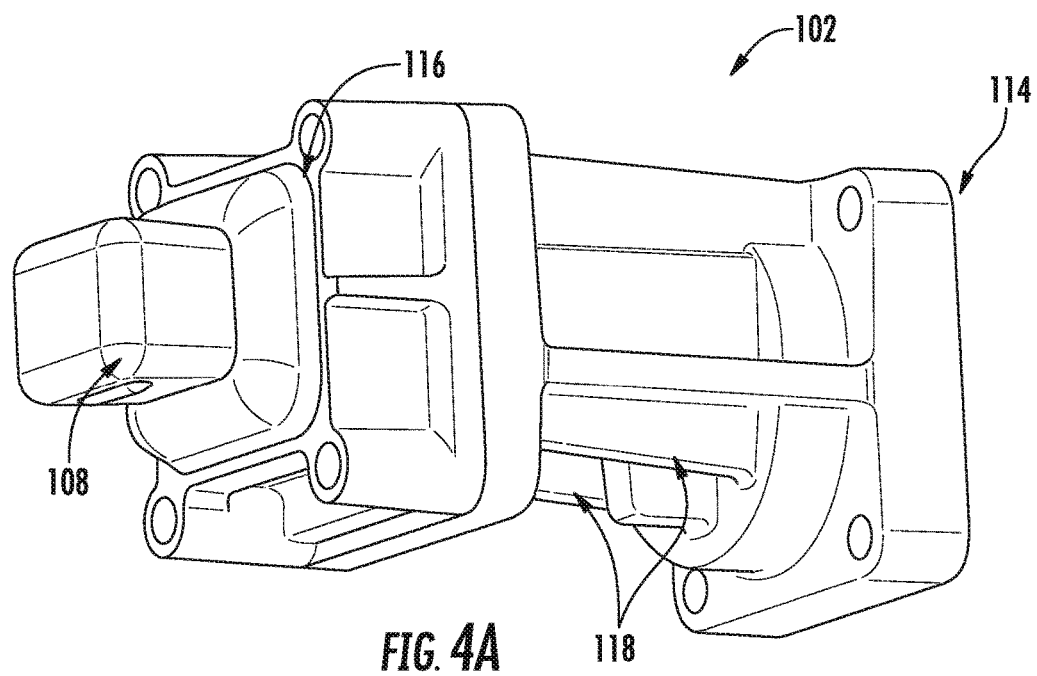
Figure 4B:
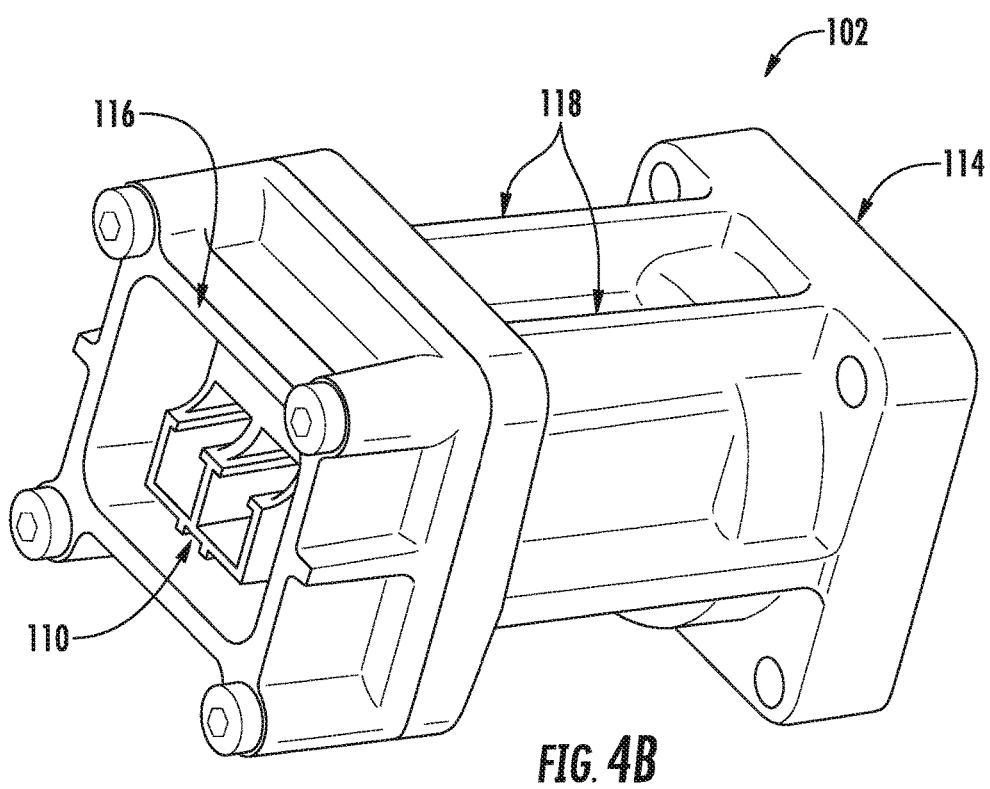
Figure 5A:
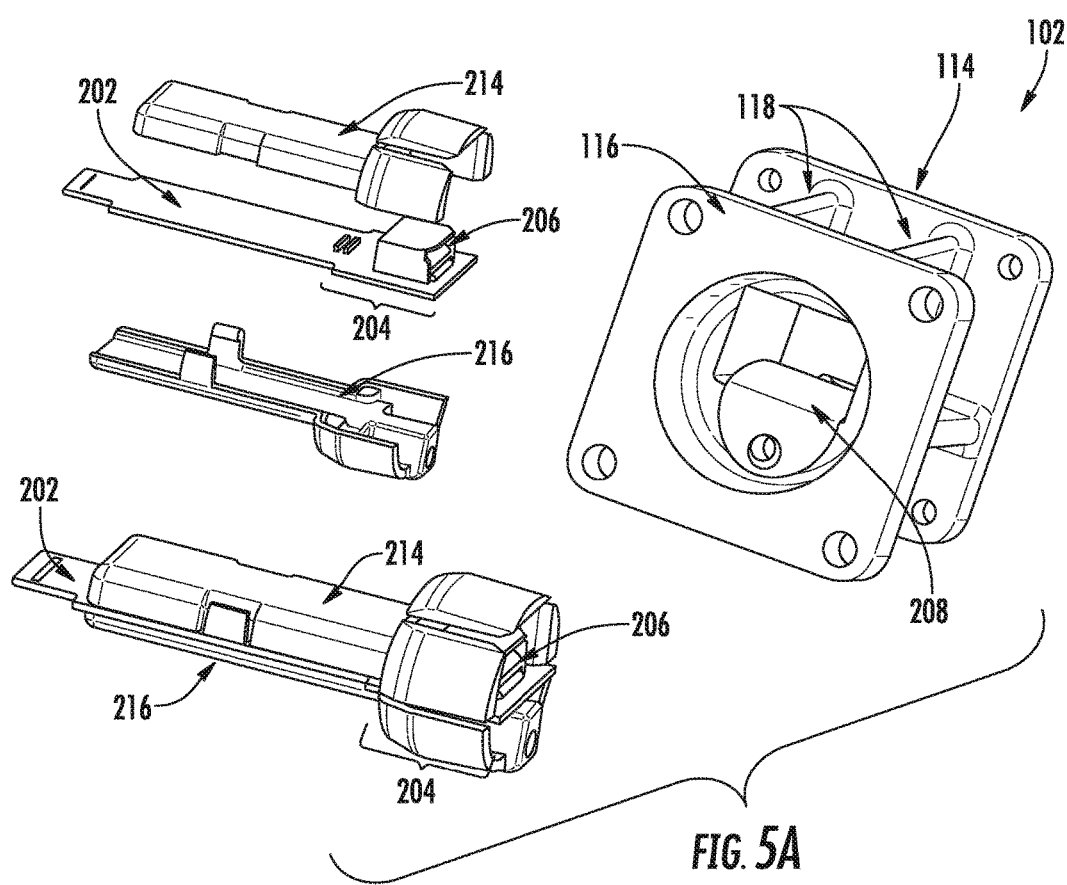
Figure 5B:
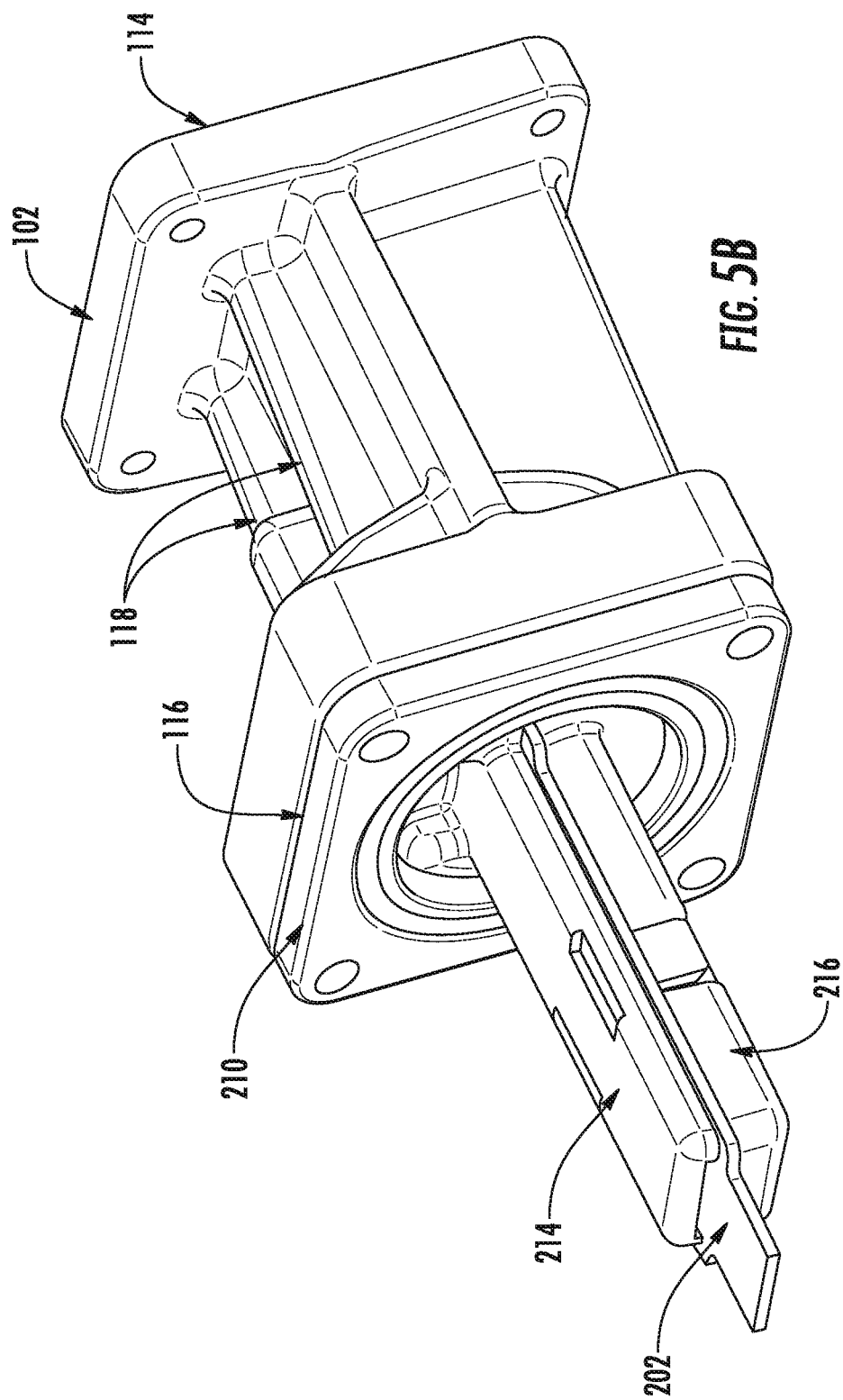

Having thus described certain embodiments of the disclosure in general terms, reference will now be made to the accompanying drawings, which are not necessarily drawn to scale, and wherein:

FIG. 1 shows a perspective view of an example radio unit assembly in accordance with some embodiments discussed herein;

FIG. 2 shows a front perspective view of the radio unit assembly of FIG. 1, in accordance with an example embodiment of the present disclosure;

FIG. 3 shows a perspective view of a heat sink housing of a connector assembly received by the radio unit assembly of FIG. 1, in accordance with an example embodiment of the present disclosure;

FIG. 4A shows the heat sink housing of FIG. 3 with a connector seal cap, in accordance with an example embodiment of the present disclosure;

FIG. 4B shows the heat sink housing of FIG. 3 without the connector seal cap of FIG. 4A, in accordance with an example embodiment of the present disclosure;

FIG. 5A shows an exploded view of a connector assembly, in accordance with an example embodiment of the present disclosure;

FIG. 5B shows the assembled connector assembly of FIG. 5A, in accordance with an example embodiment of the present disclosure; and FIG. 6 shows a cross-section view of the connector assembly of FIG. 5B in an operational configuration, in accordance with an example embodiment of the present disclosure.

DETAILED DESCRIPTION

Some embodiments of the present invention will now be described more fully hereinafter with reference to the accompanying drawings, in which some, but not all, embodiments of the invention are shown. Indeed, various embodiments of the invention may be embodied in many different forms and should not be construed as limited to the embodiments set forth herein; rather, these embodiments are provided so that this disclosure will satisfy applicable legal requirements. Like reference numerals refer to like elements throughout. As used herein, terms such as "front," "rear," "top," etc. are used in the examples provided below to describe the position of certain components or portions of components in an installed and operational configuration. As used herein, the term "module" encompasses hardware, software and/or firmware configured to perform one or more particular functions, including but not limited to conversion between electrical and optical signals and transmission of the same. As would be evident to one of ordinary skill in the art in light of the present disclosure, the term "substantially" indicates that the referenced element or associated description is accurate to within applicable engineering tolerances. As used herein, reference may be made to a "connector assembly" that includes a "heat sink housing." However, the present disclosure equally contemplates that the heat sink housing may be formed separate from the connector assembly and may be independently attachable to a radio unit assembly. Thus, use of any such terms should not be taken to limit the spirit and scope of embodiments of the present invention.

As discussed herein, an example embodiment is described with reference to a Small Form-factor Pluggable (SFP) connector as the connector assembly and optical module; however, the embodiments of the present invention may be equally applicable for use with any type of connector (e.g., Quad Small Form-factor Pluggable (QSFP) connector, C-Form-factor Pluggable (CFP) connector, and the like). Additionally, an example embodiment is described in reference to use with an RRU or an RRH in a wireless or cellular network with optical fibers as the transmission medium. Other example embodiments, however, further contemplate that additional wireless, cellular, and/or radio system equipment (e.g., Global System for Mobile Communications (GSM), Code-division multiple access (CDMA), Universal Mobile Telecommunications System (UMTS), Long-Term Evolution (LTE), or the like) may be used in conjunction with the embodiments described herein. Additionally, an example embodiment described herein may also be used with any system that uses one or more fibers for data transmission (e.g., microwave systems, distributed antenna system (DAS), or the like).

Advancements in wireless networking technology and associated infrastructure to provide reliable and consistent data transmission have resulted in equipment that allows for enhanced capacity, increased bandwidth, greater security, and increased flexibility. One example of such equipment is the various base stations and/or network access points of wireless networks. Although the base stations and/or network access points may be configured to transmit and receive wireless signals, the base stations and/or network access points may also be configured to communicate with one another over distance via optical fibers. In order to convert between the optical signals transmitted by the optical fibers and electrical signals utilized internally by, for example, base stations and/or network access points and/or wireless signals transmitted and received by, for example, base stations and/or network access points, the network may include radio unit assembles such as shown in FIG. 1. For example, optical cables (not shown) may carry optical signals as inputs to the remote radio unit (RRU) 104 of the radio unit assembly 100. The optical signals may be converted to electrical signals via optoelectronic components (e.g., a transceiver assembly), which may form a part of a connector assembly (e.g., connector assembly 200 in FIGS. 5A-6) received by the RRU 104. In some instances, the electrical signals, in turn, cause the generation of wireless signals. The electrical and/or wireless signals may then be processed by the RRU 104 and/or transmitted to other networking components or user devices (e.g., a mobile device accessing the network). In addition, electrical and/or wireless signals received or generated by the RRU 104 may be processed by the optoelectronic components of the connector assembly 200 and then converted into corresponding optical signals to be transmitted via the optical cables (not shown).

With continued reference to the radio unit assembly 100 of FIG. 1, the transmission of data as electrical signals and the conversion between optical signals and electrical signals often results in the generation of heat by the components of the RRU 104. The maximum operating temperature associated with the components of the RRU 104 is generally higher than the maximum operating temperature limit of the optoelectronic components (e.g., of the connector assembly) received by the RRU 104. As such, the heat emissions of the RRU 104 may correspond to the increased likelihood of failure of these optoelectronic components and/or interference/degradation of the corresponding electrical and/or optical signals generated by the optoelectronic components.

Accordingly, a connector assembly and heat sink housing for use with radio unit assemblies are provided to increase the thermal efficiency of the optoelectronic components utilized therein. With reference to FIGS. 1-3, example radio unit assemblies 100 configured to receive two (2) heat sink housings via two (2) corresponding receiving ports are illustrated. With respect to FIG. 2, each receiving port (e.g., a first receiving port 106 in FIGS. 1 and 3) is shown in receipt of a connector assembly such that the heat sink housing 102 is located adjacent the RRU 104. With respect to FIGS. 1 and 3, the first receiving port 106 is shown without an associated connector assembly and a second receiving port (not shown) is illustrated in receipt of an associated connector assembly. In some embodiments, the radio unit assembly 100 may include one or more heat sink housings 102, a RRU 104, a connector seal cap 108, and one or more receiving ports (e.g., first receiving port 106 in FIGS. 1 and 3). As described above, the RRU 104 may include various optical and electrical components as needed for use in a wireless network. As shown, the RRU 104 of the radio unit assembly 100 is configured to receive a connector assembly (e.g., connector assembly 200 in FIGS. 5A-6) via an associated receiving port (e.g., first receiving port 106 in FIGS. 1 and 3). When in an operational configuration, a connector assembly may be received by and mechanically and communicably connected to the RRU 104 via the receiving port 106 such that the heat sink housing 102 of the connector assembly is disposed adjacent the RRU 104. While description herein is provided to embodiments having two (2) receiving ports (e.g., first receiving port 106), the RRU 104 of the radio unit assembly 100 may define any number of receiving ports configured to receive any number of corresponding connector assemblies.

With continued reference to FIGS. 1-3, the connector assembly (e.g., connector assembly 200 in FIGS. 5A-6) may define one or more fiber attachments 110 located within the heat sink housing 102 received by the RRU 104. As will be described more fully hereafter with reference to FIGS. 4A-6, the fiber attachments 110 may be configured to receive one or more optical fibers so as to connect the RRU 104 of the radio unit assembly 100 with other networking components. Furthermore, as illustrated in FIGS. 1 and 3, the heat sink housing 102 may be secured to the RRU 104 via one or more attachment elements 112 (e.g., pins, screws, adhesives, or the like) and may define a connector seal cap 108. The optoelectronic components and other related networking circuitry housed by either or both of the RRU 104 and the heat sink housing 102 are configured to avoid hazardous contact with an exterior environment of the radio unit assembly 100. In particular, the connector seal cap 108 and/or the attachment elements 112 may be configured to preclude hazardous contact between the optoelectronic components and any external hazards (e.g., water, debris, or the like). In an operational configuration in which the connector assembly (e.g., connector assembly 200 in FIGS. 5A-6) is in receipt of one or more optical fibers, the optical fibers may further include a weatherproof cable boot (not shown) configured to seal the second end 116 of the heat sink housing 102.

With reference to FIGS. 4A-4B, the heat sink housing 102 is illustrated with a connector seal cap 108 and without a connector seal cap 108, respectively. As shown, the heat sink housing 102 may further define a first end 114 and a second end 116. As described above with reference to the fiber attachments 110, the second end 116 may be configured to receive one or more optical fibers. When in an operational configuration as shown in FIG. 4B, the heat sink housing 102 may have the connector seal cap 108 removed such that the second end 116 may receive one or more optical fibers via the fiber attachments 110. When in a nonoperational configuration as shown in FIG. 4A, the second end 116 may be enclosed by the connector seal cap 108 in order to prevent the intrusion of external hazards (e.g., water, debris, or the like) as described above. The first end 114 of the heat sink housing 102 may further be configured to engage a printed wiring board (PWB) (e.g., PWB 202 in FIGS. 5A-6) of the connector assembly in an operational configuration. In some embodiments, the first end 114 of the heat sink housing 102 may be configured to engage the RRU 104 (e.g., via attachment elements 112) as shown in FIGS. 1-3.

With continued reference to FIGS. 4A-4B, the heat sink housing 102 may further define one or more ridges 118 (e.g., protrusions, extensions, flanges, or the like) that may extend between the first end 114 and the second end 116. These ridges 118 may be configured to increase the structural integrity of the heat sink housing 102. While illustrated in FIGS. 4A-4B as longitudinal ridges that span a length of the heat sink housing 102, these ridges 118 may be located in any position, configuration, or orientation along the exterior of the heat sink housing 102. Additionally, heat sink housing 102 and the ridges 118 thereof may be formed in accordance with an example embodiment of a thermally conductive material so as to provide increased heat dissipation by facilitating heat transfer from the heat sink housing 102, and by extension the optoelectronic components housed therein, to an external environment. Said differently, the ridges 118 may operates as fins to facilitate this heat dissipation.

In this regard, the ridges 118 may increase the rate of heat transfer to an external environmental via the increased surface area contacting the external environment. In other words, by utilizing ridges 118, the heat sink housing 102 may increase its surface area for heat dissipation such that a larger area is in contact with the air of its external environment (e.g., the air from the environment that is contained and/or flowing through the ridges 118). As such, air traveling between and around the ridges 118 is able to receive more heat transferred from the body of the heat sink housing 102 than the air would have otherwise if contacting a single, flat surface. As a result, the temperature of an exterior edge of the ridges 118 (e.g., at the distal ends of the fins) should remain lower than the temperature of the rest of the heat sink housing 102 to provide a larger temperature gradient between these surfaces, thereby serving as a heat sink. The heat sink housing 102 and associated ridges 118 may be formed from any suitable material know in the art (e.g., carbon steel, aluminum, polymers, ceramics, metals and the like), particularly materials possessing high thermal conductivity.

With reference to FIGS. 5A-5B, a connector assembly 200 is illustrated in an exploded and assembled configuration, respectively. As shown, the connector assembly 200 may include a PWB 202 which includes an extension 204, one or more optoelectronic components 206, a first casing 214 and a second casing 216. As shown hereafter with reference to FIG. 6, the PWB 202 may be configured to be at least partially disposed or located within the RRU 104 when in an operational configuration. The PWB 202 (e.g., a printed circuit board (PCB) or the like) may include various optical and/or electrical components mounted thereupon. In some embodiments, the PWB 202 may include one or more optoelectronic components 206 (e.g., transducers, photodiodes, transceivers, SFP circuitry, or the like) configured to convert between electrical signals and optical signals as described above. The PWB 202 may further include or define an extension 204 that is at least partially and, in some embodiments, entirely disposed exterior to the RRU 104 when in the operational configuration. The extension 204, in some embodiments, may correspond to a portion of the PWB 202 that is disposed at an outer edge of the PWB 202 (e.g., the PWB 202 and the extension 204 are structurally formed as a single member).

Furthermore, the PWB 202 and the optoelectronic components 206 supported by the extension 204 may also be in electrical communication (e.g., via electrical traces, wiring, or the like) such that electrical signals may be transmitted between the optoelectronic components 206 supported by the extension 204 and other circuitry (e.g., optical and/or electrical components) housed by the RRU 104. By way of example, an optical signal received via an optical fiber (not shown) in communication with the one or more optoelectronic components 206 supported by the extension 204 may be converted by the one or more optoelectronic components 206 (e.g., via SFP circuitry) into an electrical signal. This electrical signal may be transmitted from the one or more optoelectronic components 206 via electrical traces defined by the extension 204 and the PWB 202 to other components within the RRU 104 that are in electrical communication with the optoelectronic components 206.

As illustrated in FIG. 5A, the heat sink housing 102 may define a compartment (e.g., spacing, opening, through-hole, cavity, etc.) through which the extension 204 extends such that the extension 204 may be located at least partially beyond an exterior edge of the RRU 114 within the heat sink housing 102 (e.g., as shown in the cross-section of FIG. 6). In such an embodiment, the extension 204 may support at least a portion of the one or more optoelectronic components 206 (e.g., transceivers, SFP modules, or the like) such that the portion of the one or more optoelectronic components 206 are similarly located exterior to the RRU 104.

As is evident by the embodiments illustrated in FIGS. 5B-6, the heat sink housing 102 may be configured to be removable from the connector assembly 200. By way of example, in some instances, the operational temperature of the RRU 104 may not exceed the maximum operating temperature limit of the optoelectronic components 206 (e.g., SFP module). In this case, the heat sink housing 102 of the connector assembly 200 may be removed from the RRU 104. In some instances, however, the operational temperature of the RRU 104 may increase due to an increased external temperature (e.g., warmer seasons) or due to an increased workload (e.g., higher bandwidth or increased intensity of usage) and the connector assembly 200 may be installed with the heat sink housing 102 so that the extension 204 of the PWB 202 may be located at least partially within the heat sink housing 102. In some embodiments, the PWB 202 and the extension 204 may be manually fixed (e.g., via adjustment by a user) in a desired position based upon the application and/or location of the radio unit assembly 100. By way of example, in installing the radio unit assembly 100 (e.g., on a cellular tower or the like), a user may install the connector assembly 200 without the heat sink housing 102 in instances in which the heat sink housing 102 is unnecessary (e.g., the operating temperature of the RRU 104 is below the maximum temperature limit of the optoelectronic components 206). Similarly, in instances in which the heat sink housing 102 is required (e.g., the operating temperature of the RRU 104 is above the maximum temperature limit of the optoelectronic components 206), a user may install the connector assembly 200 with the heat sink housing 102.

When in an operational configuration as shown in the cross-section of FIG. 6, the heat sink housing 102 may operate to shield the portion of the optoelectronic components 206 (e.g., SFP module) supported by the extension 204 from external hazards while also serving to dissipate additional amounts of heat generated by the optoelectronic components 206. As described above, the heat sink housing 102 may be disposed adjacent the RRU 104 when in an operational configuration so as to increase the space between the RRU (e.g., operating at a higher temperature) and the optoelectronic components 206 supported by the extension 204. In order to increase the dissipation of heat from the heat sink housing 102, in some embodiments, the connector assembly 200 may include a spring element 208 disposed within and, in some instances, defined by the heat sink housing 102. The spring element 208 may be located within the compartment (e.g., spacing, opening, through-hole, cavity, etc.) and configured to urge or otherwise increase contact between the heat sink housing 102 and the second casing 216, thereby increasing the contact area between the housing 102 and the optoelectronic components 206. Said differently, the location of the extension 204 (e.g., supported by the first casing 214 and the second casing 216) at least partially within the heat sink housing 102 functions to deform the spring element 208 so as to provide a substantially perpendicular force to the second casing 216 (e.g., and the bottom of the SFP module) so as to increase physical contact, and by extension thermal contact, between the optoelectronic components 206 (e.g., SFP module) and the heat sink housing 102. While described in reference to a spring element 208, the present discloses contemplate that any feature (e.g., leaf spring, spring-loaded bearing, suspension system, etc.) configured to promote contact between surfaces may be utilized by various embodiments of the present disclosure.

By increasing and maintaining the contact area between the heat sink housing 102 and the second casing 216, heat may more freely transfer between heat sink housing 102 and the optoelectronic components 206 (e.g., SFP module). In particular, the density of atoms found in solid materials is considerably larger than the density of atoms found is gases. This larger atomic density encourages heat transfer due to increased contact at an atomic level. Therefore, increasing the contact area between solid elements as opposed to gases disposed between heat sink housing 102 and the second casing 216 (e.g., and the bottom of the SFP module) may improve the heat transfer to an external environment of the connector assembly 200.

With continued reference to FIGS. 5B-6, in some embodiments, the connector assembly 200 may further include or define a separation plate 210 disposed between the RRU 104 and the heat sink housing 102 when in an operational configuration (e.g., the connector assembly 200 is received by the RRU 104). The separation plate 210 may form a weatherproof seal between the heat sink housing 102 and the RRU 104 (e.g., engaged via the first end 114) and may promote thermal isolation between the heat sink housing 102 and the RRU 104. The separation plate 210 may further be formed of a thermo-isolating material (e.g., phenolic or the like) so as to limit the heat transferred between the heat sink housing 102 and the RRH 104. Said differently, the heat sink housing 102 of the present application is configured to increase the distance between the RRH 104 and the optoelectronic components 206 (e.g., SFP module). The separation plate 210 is configured such that connector assembly 200 dissipates heat from the optoelectronic components 206 (e.g., SFP module) to an external environment of the heat sink housing 102 as opposed to heat dissipating from the RRH 104 to the heat sink housing 102 resulting in an increased temperature for the optoelectronic components 206 (e.g., SFP module).

In some embodiments, as shown in in FIGS. 5B-6, the separation plate 210 may further include or define one or more gaskets or other seal members configured to substantially seal the connector assembly 200 from the external environment, such as from the RRH 104. In one embodiment the gaskets are one or more O-rings, such as a first O-ring extending circumferentially about the compartment and facing the RRH 104 and a second O-ring extending circumferentially about the compartment and facing the heat sink housing 102. The connector assembly 200 may also include one or more adapter elements (e.g., flanges, extensions, male-to-female connectors, tabs, snaps, or the like) defined by the first casing 214 and the second casing 216. As illustrated, the adapter elements (e.g., the combination of first casing 214 and second casing 216) may be configured to substantially align the connector assembly 200 and the RRU 104 when in the operational configuration. By way of example, the adapter elements (e.g., the combination of first casing 214 and second casing 216) may be located circumferentially around the PWB 202 within the RRU 104 in order to properly align the PWB 202 with a corresponding connector of the RRU 104 and substantially align the optoelectronic components 206 (e.g., SFP module) with the compartment defined by the heat sink housing 102. Said differently, the adapter elements (e.g., the combination of first casing 214 and second casing 216) of the connector assembly 200 may be configured to engage or otherwise contact a portion of the RRU 104 when in an operational configuration to limit motion of the PWB 202 (e.g., motion substantially perpendicular with respect to the PWB 202).

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

That which is claimed is:

1. A connector assembly configured to be received by a radio unit, the connector assembly comprising: a printed wiring board (PWB) configured to be at least partially disposed within the radio unit when in an operational configuration, wherein the PWB defines an extension at least partially disposed exterior to the radio unit when in the operational configuration; one or more optoelectronic components configured to convert between optical signals and electrical signals supported by the PWB, wherein at least a portion of the one or more optoelectronic components are disposed on the extension of the PWB; and a heat sink housing attached to the PWB and disposed adjacent the radio unit when in the operational configuration, wherein the heat sink housing is configured to enclose the extension of the PWB and the portion of the one or more optoelectronic components disposed on the extension, and wherein the heat sink housing is configured to dissipate heat from the portion of the one or more optoelectronic components to an exterior environment of the connector assembly; and further comprising a separation plate disposed between the radio unit and the heat sink housing, wherein the separation plate is configured to promote thermal isolation between the heat sink housing and the radio unit.

2. The connector assembly according to claim 1, further comprising one or more gaskets defined by the separation plate configured to seal the connector assembly from the exterior environment of the connector assembly.

3. The connector assembly according to claim 1, further comprising a spring element defined by the heat sink housing, wherein the spring element is configured to urge contact between the heat sink housing and the extension of the PWB.

4. The connector assembly according to claim 3, further comprising one or more adapter elements configured to align the connector assembly and the radio unit when in the operational configuration, wherein, in the operational configuration, the heat sink housing is configured to deform the spring element so as to provide a substantially perpendicular force to at least one of the one or more adapter elements.

5. The connector assembly according to claim 1, wherein the heat sink housing defines:
 a first end configured to engage at least one of the PWB or the radio unit;
 a second end configured to receive one or more optical fibers; and
 one or more ridges extending between the first end and the second end, wherein the one or more ridges are configured to increase the structural integrity of the heat sink housing and provide increased heat dissipation.

6. The connector assembly according to claim 1, wherein the portion of the one or more optoelectronic components disposed on the extension of the PWB comprise small form pluggable optical transceiver circuitry.

7. The connector assembly according to claim 1, wherein the heat sink housing is removable from the connector assembly.

8. The connector assembly according to claim 1, further comprising one or more adapter elements configured to align the connector assembly and the radio unit when in the operational configuration.

9. The connector assembly according to claim 8, wherein the one or more adapter elements comprise a first casing and a second casing configured to support the PWB and the extension.

10. A heat sink housing comprising: a first end portion configured to engage a printed wiring board (PWB), wherein the PWB comprises an interior section configured to be received by a radio unit when in an operational configuration and an extension configured to be disposed at least partially exterior to the radio unit when in the operational configuration, a compartment disposed within the heat sink housing configured to enclose the extension of the PWB when in the operational configuration; and a second end portion configured to receive a transmission medium, wherein in the operational configuration, the heat sink housing is disposed adjacent the radio unit and configured to dissipate heat from the compartment to an exterior environment of the heat sink housing; and wherein the first end portion further comprises a separation plate configured to promote thermal isolation between the heat sink housing and the radio unit when in the operational configuration.

11. The heat sink housing according to claim 10, further comprising one or more gaskets defined by the separation plate configured to seal the first end portion of the heat sink housing from the exterior environment of the heat sink housing when in the operational configuration.

12. The heat sink housing according to claim 10, further comprising a spring element configured to urge contact between the heat sink housing and the extension of the PWB.

13. The heat sink housing according to claim 12, further comprising one or more adapter elements configured to align the PWB when in the operational configuration, wherein, in the operational configuration, the heat sink housing is configured to deform the spring element so as to provide a substantially perpendicular force to at least one of the one or more adapter elements.

14. The heat sink housing according to claim 10, wherein the extension of the PWB supports one or more optoelectronic components.

15. The heat sink housing according to claim 10, wherein the heat sink housing is removable from the radio unit.

16. The heat sink housing according to claim 10, wherein the transmission medium comprises one or more optical fibers.

17. The heat sink housing according to claim 10, further comprising one or more adapter elements configured to align the PWB when in the operational configuration.

18. The heat sink housing according to claim 17, wherein the one or more adapter elements comprise a first casing and a second casing configured to support the PWB and the extension.

* * * * *